(12) United States Patent
Bai et al.

(10) Patent No.: US 12,136,550 B2
(45) Date of Patent: Nov. 5, 2024

(54) METHOD FOR MANUFACTURING A SEMICONDUCTOR STRUCTURE AND A SEMICONDUCTOR STRUCTURE

(71) Applicant: CHANGXIN MEMORY TECHNOLOGIES, INC., Hefei (CN)

(72) Inventors: Jie Bai, Hefei (CN); Kang You, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 394 days.

(21) Appl. No.: 17/447,169

(22) Filed: Sep. 8, 2021

(65) Prior Publication Data
US 2022/0223419 A1    Jul. 14, 2022

Related U.S. Application Data

(63) Continuation of application No. PCT/CN2021/103729, filed on Jun. 30, 2021.

(30) Foreign Application Priority Data

Jan. 11, 2021  (CN) .......................... 202110033539.7

(51) Int. Cl.
*H01L 21/225*   (2006.01)
*H01L 21/311*   (2006.01)
*H01L 27/092*   (2006.01)

(52) U.S. Cl.
CPC .... *H01L 21/2255* (2013.01); *H01L 21/31111* (2013.01); *H01L 21/31144* (2013.01); *H01L 27/092* (2013.01)

(58) Field of Classification Search
CPC ........... H01L 21/2255; H01L 21/31111; H01L 21/31144; H01L 27/092
See application file for complete search history.

(56) References Cited

U.S. PATENT DOCUMENTS

| 7,838,908 B2 | 11/2010 | Kwon |
| 8,017,469 B2 | 9/2011 | Luo |

(Continued)

FOREIGN PATENT DOCUMENTS

| CN | 101814502 A | 8/2010 |
| CN | 102292800 A | 12/2011 |

(Continued)

OTHER PUBLICATIONS

Veloso A et al: "Flexible and robust capping-metal gate integration technology enabling multiple-VT CMOS in MuGFETs", VLSI Technology, 2008 Symposium on, IEEE, Piscataway, NJ, USA, Jun. 17, 2008 (Jun. 17, 2008), pp. 14-15, XP031297916, ISBN: 978-1-4244-1802-2.

(Continued)

*Primary Examiner* — Monica D Harrison
*Assistant Examiner* — Andre C Stevenson
(74) *Attorney, Agent, or Firm* — Syncoda LLC; Feng Ma

(57) ABSTRACT

A method for manufacturing a semiconductor structure includes: forming a first diffusion film layer on a dielectric layer, a thickness of the first diffusion film layer being not less than a thickness of a doped layer; forming a hard mask on the first diffusion film layer; etching each film layer corresponding to a first region and a second region toward a substrate, until the first diffusion film layer corresponding to the first region is exposed; and next, removing a first metal oxide layer remaining on the dielectric layer corresponding to the second region. As a result of the presence of the doped layer, the hard mask corresponding to the second region has a relatively small thickness.

19 Claims, 9 Drawing Sheets

(56) References Cited

U.S. PATENT DOCUMENTS

| | | | |
|---|---|---|---|
| 8,021,939 | B2 | 9/2011 | Chudzik |
| 8,232,154 | B2 | 7/2012 | Chien |
| 8,232,606 | B2 | 7/2012 | Chudzik |
| 8,309,419 | B2 * | 11/2012 | Schaeffer ............ H01L 29/1054 |
| | | | 438/287 |
| 8,941,184 | B2 | 1/2015 | Ando |
| 8,969,878 | B2 | 3/2015 | Kim |
| 9,245,759 | B2 | 1/2016 | Schram et al. |
| RE45,955 | E | 3/2016 | Luo |
| 9,330,938 | B2 * | 5/2016 | Ando .............. H01L 21/823842 |
| 2009/0152650 | A1 | 6/2009 | Chudzik |
| 2010/0184260 | A1 | 7/2010 | Luo |
| 2010/0187610 | A1 | 7/2010 | Kwon |
| 2010/0197128 | A1 | 8/2010 | Schaeffer |
| 2011/0070702 | A1 | 3/2011 | Chien |
| 2011/0215413 | A1 | 9/2011 | Ikeno |
| 2011/0227171 | A1 | 9/2011 | Chudzik |
| 2013/0154019 | A1 | 6/2013 | Ando |
| 2013/0299914 | A1 | 11/2013 | Kim |
| 2014/0106556 | A1 | 4/2014 | Schram et al. |
| 2015/0102418 | A1 | 4/2015 | Kim |
| 2019/0067127 | A1 | 2/2019 | Zhang et al. |

FOREIGN PATENT DOCUMENTS

| | | |
|---|---|---|
| CN | 103426928 A | 12/2013 |
| CN | 105448831 A | 3/2016 |
| CN | 105529327 B | 3/2019 |
| CN | 109786448 A | 5/2019 |
| FR | 2952225 B1 | 3/2012 |

OTHER PUBLICATIONS

Ritzenthaler Romain et al: "Diffusion and Gate Replacement: A New Gate-First High-k/Metal Gate CMOS Integration Scheme Suppressing Gate Height Asymmetry", IEEE Transactions on Electron Devices, IEEE, USA, vol. 63, No. 1, Jan. 2016 (Jan. 2016), pp. 265-271, XP011594975, ISSN: 0018-9383, DOI: 10.1109/TED.2015.2501721.

Supplementary European Search Report in the European application No. 21878741.4, mailed on Dec. 2, 2022.

International Search Report in the international application No. PCT/CN2021/103732, mailed on Oct. 14, 2021.

International Search Report in the international application No. PCT/CN2021/103729, mailed on Sep. 27, 2021.

Supplementary European Search Report in application No. EP 21917028, mailed on Jun. 11, 2024.

* cited by examiner

METHOD FOR MANUFACTURING A SEMICONDUCTOR STRUCTURE AND A SEMICONDUCTOR STRUCTURE

CROSS-REFERENCE TO RELATED APPLICATIONS

This is a continuation of International Patent Application No. PCT/CN2021/103729 filed on Jun. 30, 2021, which claims priority to Chinese Patent Application No. 202110033539.7 filed on Jan. 11, 2021. The disclosures of these applications are hereby incorporated by reference in their entirety.

BACKGROUND

Semiconductor structures are generally used on electronic devices such as memory devices and controllers. When a semiconductor structure is applied to a memory, a large number of Metal Oxide Semiconductor Field Effect Transistors (MOSFETs) are provided in a peripheral region outside a core region storing data.

SUMMARY

Embodiments of the present disclosure relate generally to the field of semiconductor manufacturing technologies, and more specifically to a method for manufacturing a semiconductor structure and a semiconductor structure.

Embodiments of the present disclosure provide a method for manufacturing a semiconductor structure, including: providing a substrate, the substrate including a first region, and a second region located outside the first region; forming a doped layer doped with a preset metal on the substrate corresponding to the second region; forming a dielectric layer on the substrate corresponding to the first region, and on the doped layer corresponding to the second region; forming a first diffusion film layer on the dielectric layer, the first diffusion film layer including a first metal oxide layer, and the thickness of the first diffusion film layer being not less than a thickness of the doped layer; forming a hard mask on the first diffusion film layer by using a spin coating method; etching each film layer corresponding to the first region and the second region toward the substrate, until the first diffusion film layer corresponding to the first region is exposed; removing the first metal oxide layer remaining on the dielectric layer corresponding to the second region; forming a second diffusion film layer on the first diffusion film layer corresponding to the first region, and on the dielectric layer corresponding to the second region, the second diffusion film layer including a second metal oxide layer; and performing heat treatment on the remaining film layers corresponding to the first region and the second region.

Embodiments of the present disclosure further provide a semiconductor structure, including: a substrate, the substrate including a first region, and a second region located outside the first region; a doped layer doped with a preset metal being provided on the substrate corresponding to the second region; a dielectric layer being provided on the substrate corresponding to the first region, and on the doped layer corresponding to the second region; a first diffusion film layer being provided on the dielectric layer corresponding to the first region, and the first diffusion film layer including a first metal oxide layer; and a second diffusion film layer being provided on the dielectric layer corresponding to the second region, and the second diffusion film layer including a second metal oxide layer.

According to the method for manufacturing a semiconductor structure and the semiconductor structure provided in the embodiments, the substrate includes the first region and the second region located outside the first region, and the doped layer is formed on the substrate corresponding to the second region; then, the dielectric layer is formed on the substrate corresponding to the first region, and on the doped layer corresponding to the second region; the first diffusion film layer is formed on the dielectric layer, the first diffusion film layer includes the first metal oxide layer, and the thickness of the first diffusion film layer is not less than a thickness of the doped layer; the hard mask is formed on the first diffusion film layer by using the spin coating method; each film layer corresponding to the first region and the second region is etched toward the substrate, until the first diffusion film layer corresponding to the first region is exposed; and next, the first metal oxide layer remaining on the dielectric layer corresponding to the second region is removed.

BRIEF DESCRIPTION OF THE DRAWINGS

To describe the technical solutions in embodiments of the present disclosure or the prior art more clearly, the accompanying drawings required for describing the embodiments or the prior art are briefly introduced below. Apparently, the accompanying drawings in the following description show merely some embodiments of the present disclosure, and persons skilled in the art can still derive other accompanying drawings from these accompanying drawings without involving an inventive effort.

DETAILED DESCRIPTION

Figure 1:
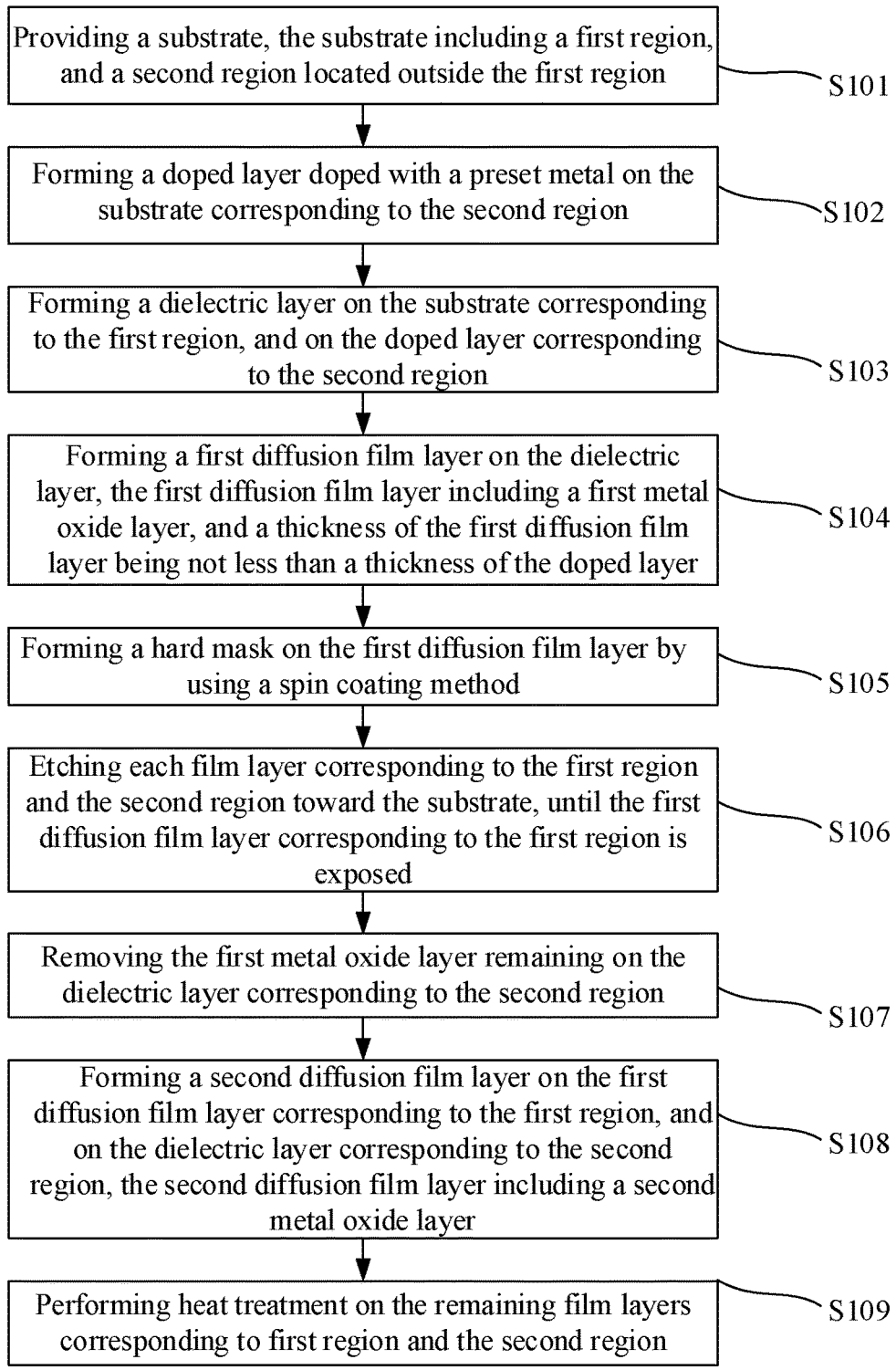
FIG. 1 is a flowchart of a method for manufacturing a semiconductor structure provided according to an embodiment of the present disclosure.

To describe the purpose, the technical solutions and the advantages of embodiments of the present disclosure more clearly, the technical solutions in the embodiments of the present disclosure are described more clearly and integrally by combining the accompanying drawings in the embodiments of the present disclosure. Apparently, the described embodiments are some of the embodiments of the present disclosure, but not all the embodiments. Based on the embodiments of the present disclosure, all other embodiments obtained by persons skilled in the art without involving an inventive effort shall fall within the scope of protection of the present disclosure.

A MOSFET generally can include a P-type transistor (PMOS) and an N-type transistor (NMOS) according to different doping types. When a high-k dielectric layer is manufactured, a dielectric layer is first formed on a substrate, and the substrate has a first region, and a second region located outside the first region; generally, a first titanium nitride layer and an aluminum oxide layer are sequentially formed on the dielectric layer, the first titanium nitride layer and the aluminum oxide layer corresponding to the first region are removed, and the first titanium nitride layer and the aluminum oxide layer corresponding to the second region are retained; then, a second titanium nitride layer and a lanthanum oxide layer are formed, and the lanthanum oxide layer and the second titanium nitride layer corresponding to the second region are removed; annealing treatment is performed on the first region and the second region to diffuse an aluminum element into the dielectric layer corresponding to the second region and diffuse a lanthanum element into the dielectric layer corresponding to the first region; and next, a metal gate is formed on the dielectric layer, such that each film layer corresponding to the first region forms an N-type transistor, and each film layer corresponding to the second region forms a P-type transistor.

However, after the aluminum oxide layer is formed, the first titanium nitride layer and the aluminum oxide layer corresponding to the first region are removed with etching, an etching duration is difficult to control, and the film layers corresponding to the second region are prone to damages.

The semiconductor structures can be used on electronic devices such as memory devices such as Dynamic Random-Access Memory (DRAM) devices and controllers. When a semiconductor structure is applied to a memory, the memory includes a core region for storing data and a peripheral region for routing a peripheral circuit, etc., and the respective semiconductor structure is generally provided in the peripheral region.

In an example, a Metal Oxide Semiconductor Field Effect Transistor (MOSFET) includes a P-type transistor (PMOS) and an N-type transistor (NMOS) according to different doping types. When a high-k dielectric layer is manufactured, a dielectric layer is formed on a substrate, and the substrate has a first region, and a second region located outside the first region; generally, a first titanium nitride layer and an aluminum oxide layer are sequentially formed on the dielectric layer, the first titanium nitride layer and the aluminum oxide layer corresponding to the first region are removed, and the first titanium nitride layer and the aluminum oxide layer corresponding to the second region are retained; then, a second titanium nitride layer and a lanthanum oxide layer are formed, and the lanthanum oxide layer and the second titanium nitride layer corresponding to the second region are removed; annealing treatment is performed on the first region and the second region to diffuse an aluminum element into the dielectric layer corresponding to the second region and diffuse a lanthanum element into the dielectric layer corresponding to the first region; next, a metal gate is formed on the dielectric layer, such that each film layer corresponding to the first region forms the NMOS, and each film layer corresponding to the second region forms the PMOS.

However, after the aluminum oxide layer is formed, the first titanium nitride layer and the aluminum oxide layer corresponding to the first region are removed with etching, an etching duration is difficult to control, and the film layers corresponding to the second region are prone to damage.

According to a method for manufacturing a semiconductor structure and a semiconductor structure provided in the embodiments, a doped layer doped with a preset metal is provided between a substrate and a dielectric layer corresponding to a second region, and after a first diffusion film layer is formed on the dielectric layer, a hard mask is formed on the dielectric layer by using a spin coating method; the thickness of the first diffusion film layer is not less than a thickness of the doped layer; each film layer corresponding to the first region and the second region is etched until the first diffusion film layer corresponding to the first region is exposed. Due to the presence of the doped layer, there is a large distance between the doped layer corresponding to the second region and the substrate, and the hard mask corresponding to the second region has a small thickness. When the first diffusion film layer corresponding to the first region is exposed, the first diffusion film layer corresponding to the second region is just completely removed or a part of the first diffusion film layer remains, such that damage to the film layers corresponding to the second region is avoided.

The method for manufacturing a semiconductor structure provided according to this embodiment is used for manufacturing the semiconductor structure, the semiconductor structure may include the DRAM, etc., and the semiconductor structure is not limited in this embodiment.

As shown in FIG. 1, the method for manufacturing a semiconductor structure provided according to this embodiment includes the following step.

In S101, a substrate is provided, and the substrate includes a first region, and a second region located outside the first region.

Figure 2:
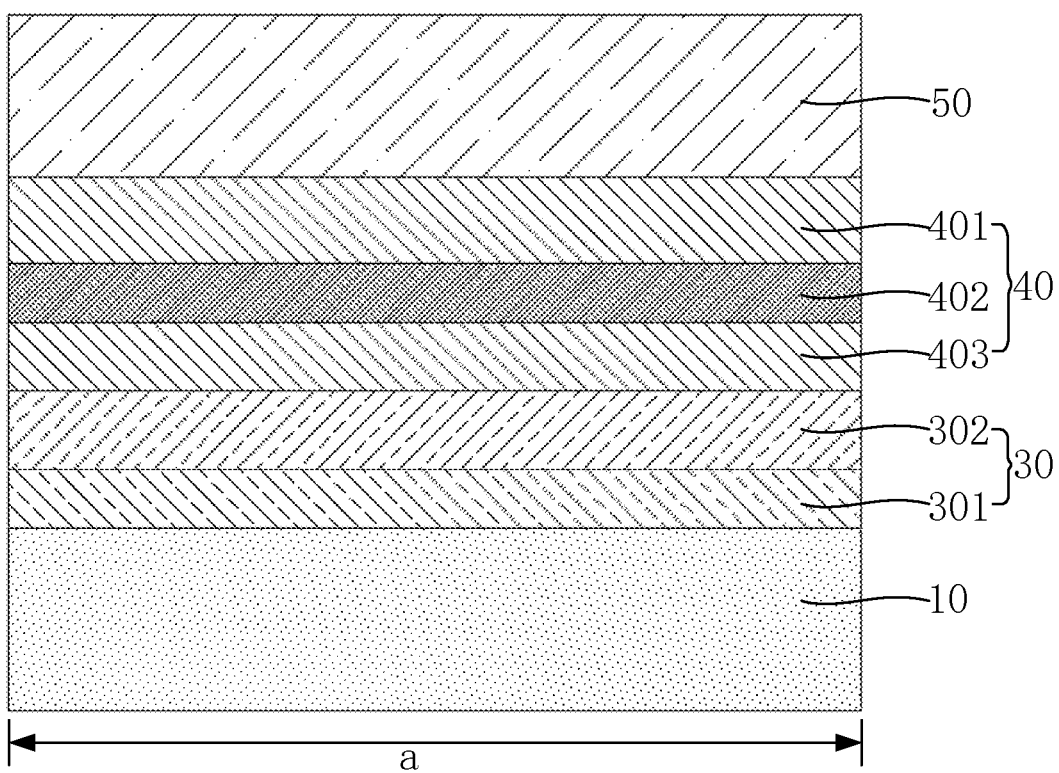
FIG. 2 is a schematic structural diagram corresponding to a first region after forming a mask layer in a method for manufacturing a semiconductor structure provided according to an embodiment of the present disclosure.
Figure 3:
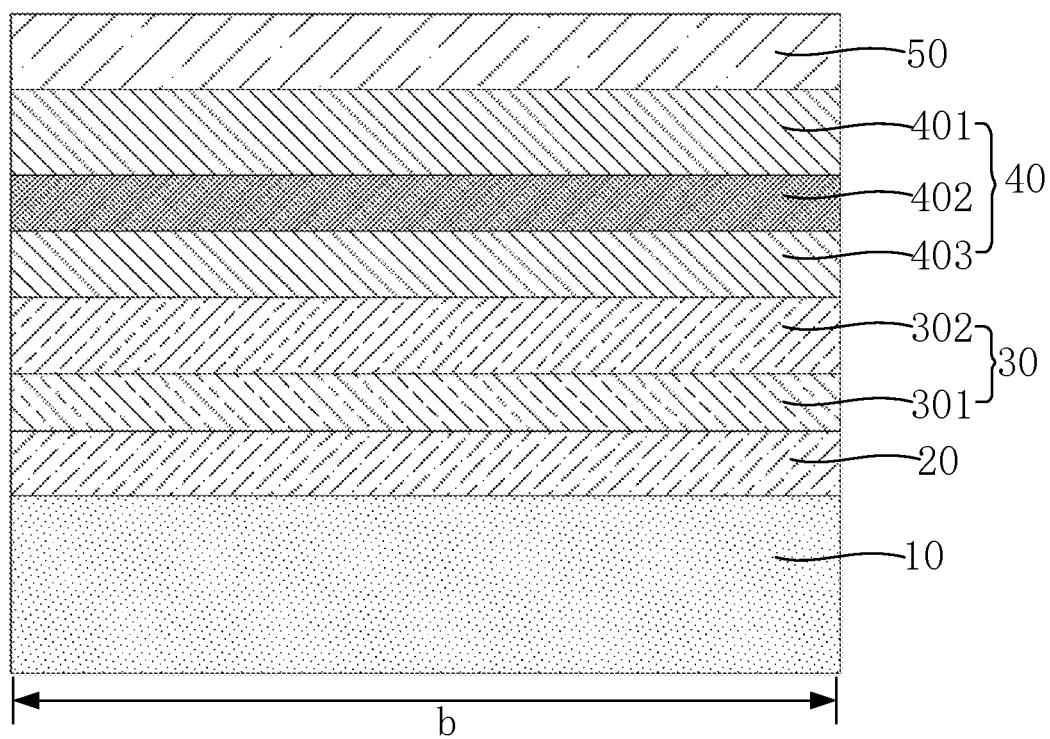
FIG. 3 is a schematic structural diagram corresponding to a second region after forming a mask layer in a method for manufacturing a semiconductor structure provided according to an embodiment of the present disclosure.

Referring to FIGS. 2 and 3, illustratively, the substrate 10 is plate-shaped, and the substrate 10 may serve as a basis for film layers formed in subsequent steps to support the other film layers formed in the subsequent steps. The substrate 10 can be made of silicon, germanium, etc. The material of the substrate 10 is not limited in this embodiment.

In an implementation in which the semiconductor structure is a DRAM, the substrate 10 includes a core region and a peripheral region located at the periphery of the core region, the core region is used for storing data, and the first region "a" and the second region "b" can be located in the peripheral region.

Further, the first region "a" and the second region "b" can be spaced apart, and of course, the first region "a" and the second region "b" can be adjacent, which is not limited in this embodiment.

With continued reference to FIG. 1, the method for manufacturing a semiconductor structure provided according to this embodiment, after forming the substrate 10, further includes the following step.

In S102, a doped layer doped with a preset metal is formed on the substrate corresponding to the second region.

With continued reference to FIGS. 2 and 3, the doped layer 20 may adjust the distance from each film layer subsequently formed in the second region "b" to the substrate 10. Illustratively, the doped layer 20 can be made of silicon, germanium, etc. During manufacturing, a layer of silicon can be first formed on the substrate 10 corresponding to the second region "b", and then, germanium is doped in the silicon layer to form the doped layer 20. In other implementations, the thickness of the substrate 10 in the second region "b" is greater than that of the substrate 10 in the first region "a". Then, germanium is doped on one side of the substrate 10 in the second region "b", thereby forming the doped layer 20 located on one side of the substrate 10 in the second region "b".

With continued reference to FIG. 1, the method according to this embodiment, after forming the doped layer 20, further includes the following step.

In S103, a dielectric layer is formed on the substrate corresponding to the first region, and on the doped layer corresponding to the second region.

With continued reference to FIGS. 2 and 3, illustratively, the forming a dielectric layer 30 on the substrate 10 corresponding to the first region "a" and the doped layer 20 corresponding to the second region "b" includes: a first dielectric layer 301 and a second dielectric layer 302 are sequentially stacked on the substrate 10 corresponding to the first region "a" and the doped layer 20 corresponding to the second region "b", and a dielectric constant of the second dielectric layer 302 is higher than the dielectric constant of the first dielectric layer 301. That is to say, the dielectric layer 30 includes the first dielectric layer 301 and the second dielectric layer 302 which are stacked, and the first dielectric layer 301 is provided proximal to the substrate 10.

Through the arrangement, the dielectric constant of the second dielectric layer 302 is greater than the dielectric constant of the first dielectric layer 301, such that the performance of the semiconductor structure can be improved. Illustratively, the first dielectric layer 301 can be made of silicon oxide, aluminum oxide, zirconium oxide, etc, and the second dielectric layer 302 can be made of a high-k material such as hafnium silicate and zirconium silicate.

With continued reference to FIG. 1, the method for manufacturing a semiconductor structure provided according to this embodiment, after forming the dielectric layer 30, further includes the following step.

In S104, a first diffusion film layer is formed on the dielectric layer, the first diffusion film layer includes a first metal oxide layer, and the thickness of the first diffusion film layer is not less than a thickness of the doped layer.

With continued reference to FIGS. 2 and 3, specifically, the first diffusion film layer 40 is formed on the dielectric layer 30 corresponding to the first region "a" and the second region "b", and the thickness of the first diffusion film layer 40 is not less than a thickness of the doped layer 20. That is to say, the thickness of the first diffusion film layer 40 is greater than or equal to a thickness of the doped layer 20.

In this embodiment, the first diffusion film layer 40 includes a first metal oxide layer 402, and the first metal oxide layer 402 can be made of lanthanum oxide, etc.

In some embodiments, the specific steps of forming the first diffusion film layer 40 may include sequentially forming a barrier layer 403, the first metal oxide layer 402, and a protective layer 401 on the dielectric layer 30. That is to say, the first diffusion film layer 40 includes the barrier layer 403, the first metal oxide layer 402, and the protective layer 401 which are stacked. The first metal oxide layer 402 is located between the barrier layer 403 and the protective layer 401, and the barrier layer 403 is provided proximal to the substrate 10. Through the arrangement, the protective layer 401 may protect the first metal oxide layer 402, thereby avoiding damage to the first metal oxide layer 402 during the manufacturing process, and the barrier layer 403 may adjust the diffusion rate of a first metal element in the first metal oxide layer 402 to the dielectric layer 30 during subsequent heat treatment.

With continued reference to FIG. 1, further, the method for manufacturing a semiconductor structure provided in this embodiment, after forming the first diffusion film layer 40, further includes the following step.

In S105, a hard mask is formed on the first diffusion film layer by using a spin coating method.

With continued reference to FIGS. 2 and 3, the hard mask 50 is formed on the first diffusion film layer 40 corresponding to the first region "a" and the second region "b" by using a spin coating method, such that the distance between a top surface of the hard mask 50 distal from the substrate 10 corresponding to the first region "a" and the substrate 10 is equal to the distance between a top surface of the mask layer 50 distal from the substrate 10 corresponding to the second region "b" and the substrate 10.

Illustratively, the hard mask 50 can be made of carbon, etc. The material of the hard mask 50 is not limited in this embodiment.

With continued reference to FIG. 1, further, the method for manufacturing a semiconductor structure provided in this embodiment, after forming the hard mask 50, further includes the following step.

In S106, each film layer corresponding to the first region and the second region is etched toward the substrate, until the first diffusion film layer corresponding to the first region is exposed.

Figure 4:
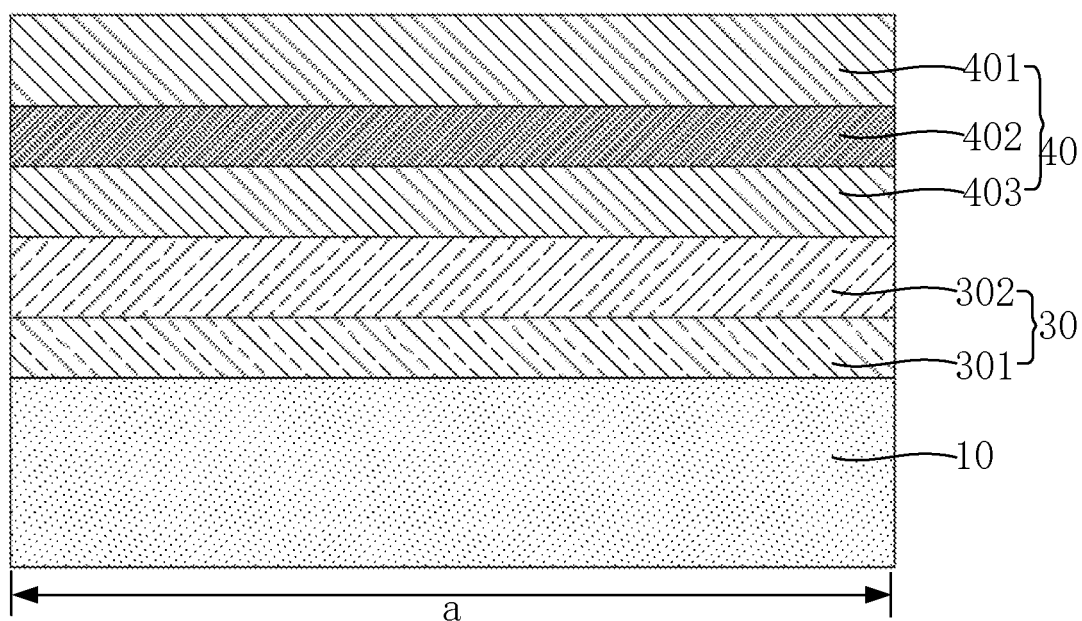
FIG. 4 is a schematic structural diagram corresponding to a first region after etching film layers corresponding to the first region and a second region to a substrate in a method for manufacturing a semiconductor structure provided according to an embodiment of the present disclosure.
Figure 5:
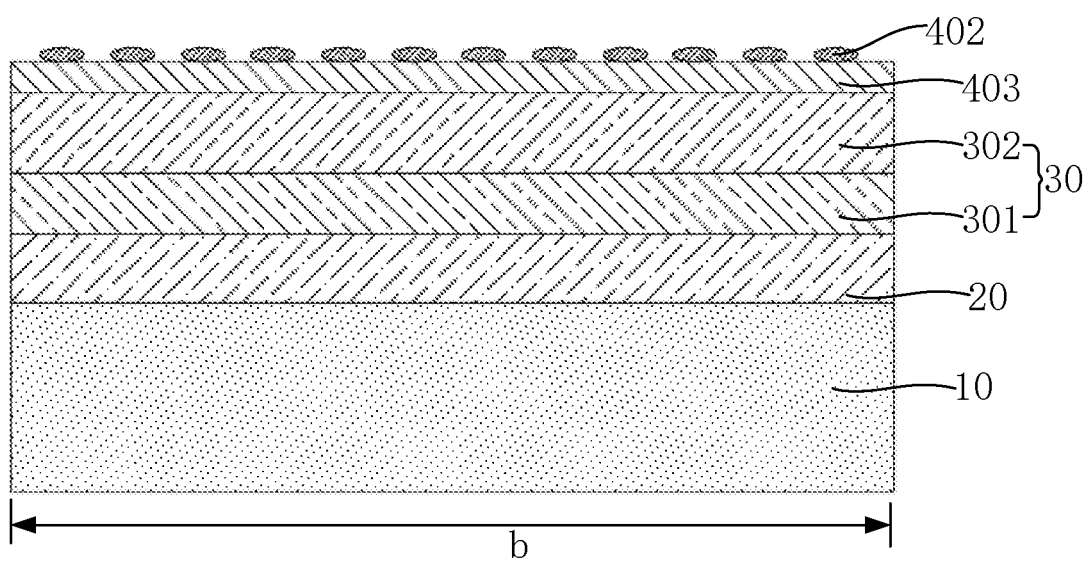
FIG. 5 is a schematic structural diagram corresponding to a second region after etching film layers corresponding to a first region and the second region to a substrate in a method for manufacturing a semiconductor structure provided according to an embodiment of the present disclosure.

Referring to FIGS. 4 and 5, illustratively, each film layer corresponding to the first region "a" and the second region "b" is etched toward the substrate 10 with dry etching, until the first diffusion film layer 40 corresponding to the first region "a" is exposed. With dry etching, the etching precision is high, and thus, the precision of the semiconductor structure is improved.

In the foregoing implementation, since the doped layer 20 is provided between the substrate 10 and the dielectric layer 30 of the second region "b", a top surface, distal from the substrate 10, of the first diffusion film layer 40 corresponding to the second region "b" is farther distal from the substrate 10 than a top surface, distal from the substrate 10, of the first diffusion film layer 40 corresponding to the first region "a". Since the distance between the top surface of the mask layer 50 corresponding to the first region "a" and the substrate 10 is equal to the distance between the top surface of the mask layer 50 corresponding to the second region "b" and the substrate 10, when the first diffusion film layer 40 corresponding to the first region "a" is exposed, the first diffusion film layer 40 corresponding to the second region "b" has been etched. Further, the thickness of the first diffusion film layer 40 is greater than or equal to a thickness of the doped layer 20, such that when the first diffusion film layer 40 corresponding to the first region "a" is exposed, the first diffusion film layer 40 corresponding to the second region "b" has been completely etched, or a large part of the first diffusion film layer 40 corresponding to the second region "b" has been etched. Therefore, damage to the film layers in the first region "a" is avoided.

In the foregoing implementation, the thickness of the doped layer 20 is greater than the sum of the thickness of the first metal oxide layer 402 and the thickness of the barrier layer 401. Through the arrangement, when the film layers corresponding to the first region "a" and the second region "b" are etched to the substrate, a part of the barrier layer 401 corresponding to the second region "b" can be retained.

Specifically, in the implementation in which the first diffusion film layer 40 includes the barrier layer 403, the first metal oxide layer 402, and the protective layer 401 which are stacked, in said etching each film layer corresponding to the first region "a" and the second region "b" toward the substrate 10 until the first diffusion film layer 40 corresponding to the first region "a" is exposed, the protective layer 401, the first metal oxide layer 402, and a part of the barrier layer 403 corresponding to the second region "b" are removed. A part of the barrier layer 403 corresponding to the second region "b" is retained, such that the dielectric layer 30 or another film layer corresponding to the second region "b" is prevented from being damaged.

Further, after the protective layer 401, the first metal oxide layer 402, and a part of the barrier layer 403 corresponding to the second region "b" are removed, the thickness of the barrier layer 403 corresponding to the second region "b" is 0.1-2 nm.

With continued reference to FIG. 1, the method for manufacturing a semiconductor structure provided according to this embodiment, after etching each film layer corresponding to the first region "a" and the second region "b" until the first diffusion film layer 40 corresponding to the first region "a" is exposed, further includes the following step.

In S107, the first metal oxide layer remaining on the dielectric layer corresponding to the second region is removed.

Figure 6:
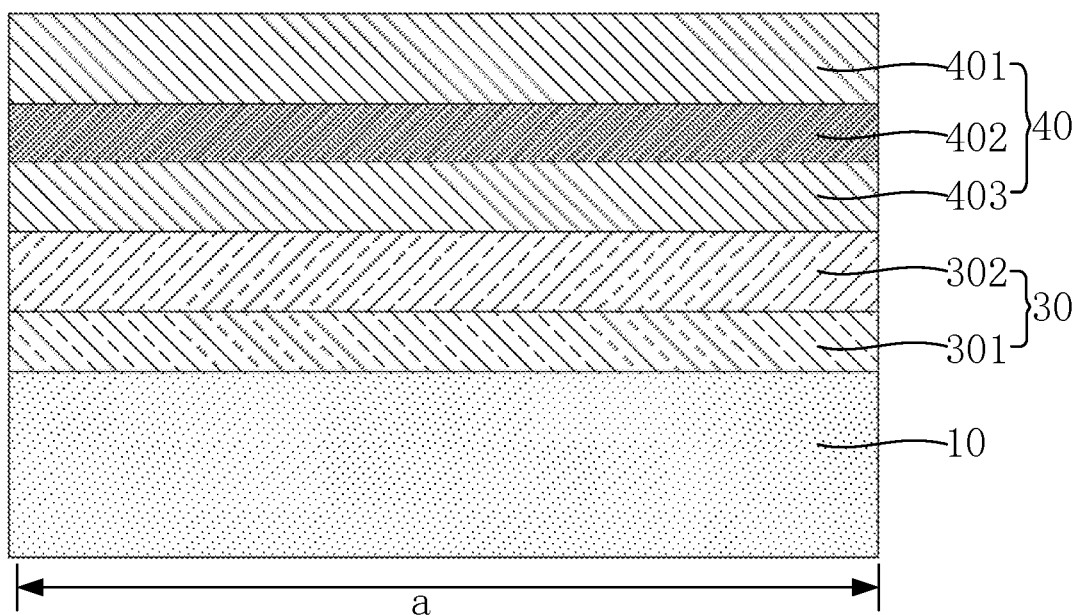
FIG. 6 is a schematic structural diagram corresponding to a first region after removing a first metal oxide layer remaining on a dielectric layer corresponding to a second region in a method for manufacturing a semiconductor structure provided according to an embodiment of the present disclosure.
Figure 7:
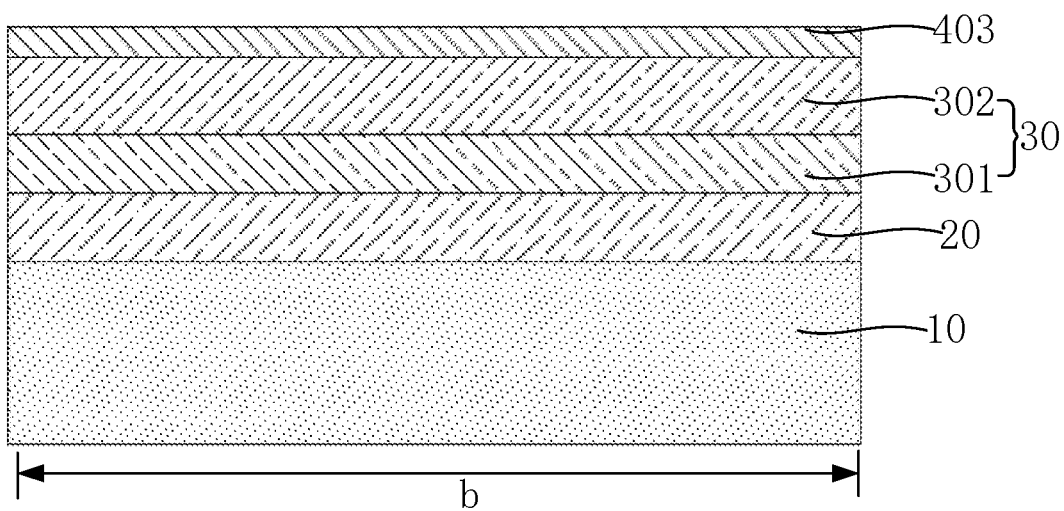
FIG. 7 is a schematic structural diagram corresponding to a second region after removing a first metal oxide layer remaining on a dielectric layer corresponding to the second region in a method for manufacturing a semiconductor structure provided according to an embodiment of the present disclosure.

With continued reference to FIGS. 4 and 5, in the implementation in which the first diffusion film layer 40 includes the barrier layer 403, the first metal oxide layer 402, and the protective layer 401 which are sequentially stacked in a direction distal from the substrate 10, in said etching the film layers corresponding to the first region "a" and the second region "b", the protective layer 401, the first metal oxide layer 402, and the barrier layer 403 are sequentially etched. Illustratively, at the end of etching, a part of barrier layer 403 remains on the dielectric layer 30 corresponding to the second region "b", and a part of the first metal oxide layer 402 remains on the corresponding barrier layer 403. As shown in FIGS. 6 and 7, in this case, a part of the first metal oxide layer 402 remaining on the dielectric layer 30 corresponding to the second region "b" is removed, thereby preventing the remaining first metal oxide layer 402 from affecting the performance of a transistor formed in the second region "b".

Illustratively, the first metal oxide layer 402 remaining on the dielectric layer 30 corresponding to the second region "b" can be removed with wet etching. The remaining first metal oxide layer 402 is selectively removed with wet etching, thereby avoiding influence on other film layers when the remaining first metal oxide layer 402 is etched.

With continued reference to FIG. 1, the method for manufacturing a semiconductor structure provided according to this embodiment, after removing the first metal oxide layer 402 remaining on the dielectric layer 30 corresponding to the second region "b", further includes the following step.

In S108, a second diffusion film layer is formed on the first diffusion film layer corresponding to the first region, and on the dielectric layer corresponding to the second region, and the second diffusion film layer includes a second metal oxide layer.

Figure 8:
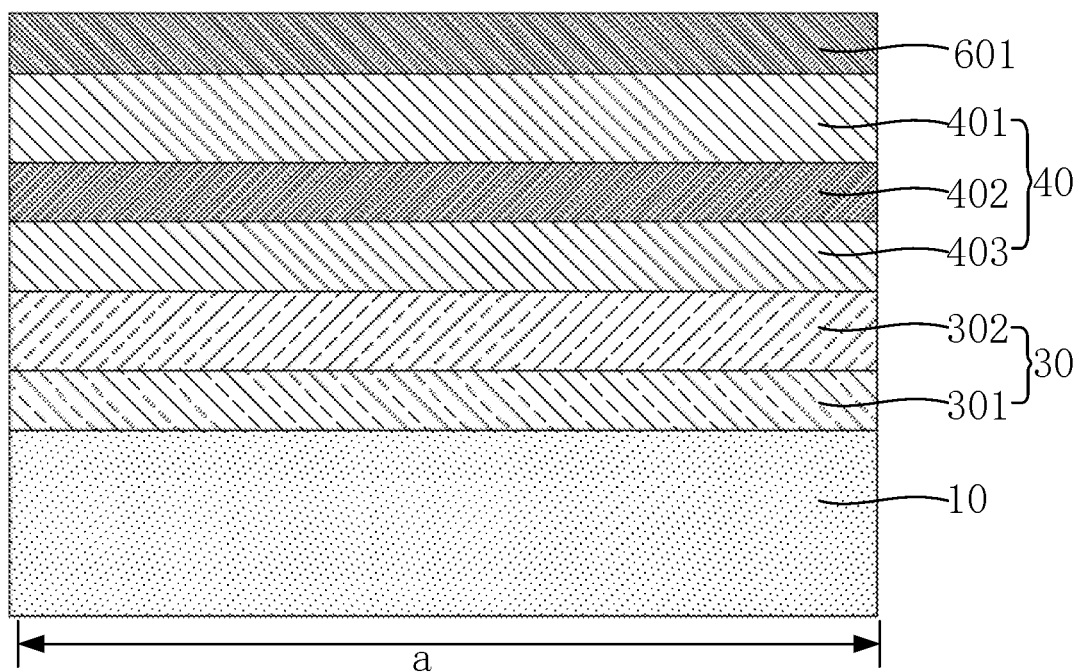
FIG. 8 is a schematic structural diagram corresponding to a first region after forming a second metal oxide semiconductor layer in a method for manufacturing a semiconductor structure provided according to an embodiment of the present disclosure.
Figure 9:
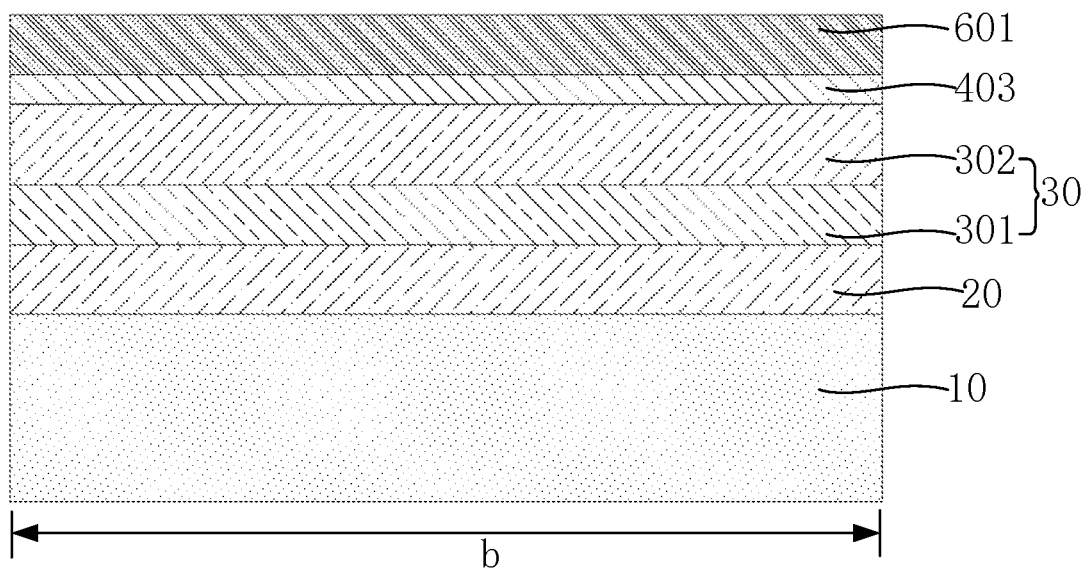
FIG. 9 is a schematic structural diagram corresponding to a second region after forming a second metal oxide semiconductor layer in a method for manufacturing a semiconductor structure provided according to an embodiment of the present disclosure.

As shown in FIGS. 8 and 9, illustratively, the second metal oxide layer 601 may include aluminum oxide, etc., and the material of the second metal oxide layer 601 is not limited in this embodiment. The second diffusion film layer may only include the second metal oxide layer 601, and of course, the second diffusion film layer may also include the second metal oxide layer 601 and another film layer covering the second metal oxide layer 601. Another film layer can be a titanium nitride layer for protecting the second metal oxide layer 601.

In the implementation in which the first diffusion film layer 40 includes the barrier layer 403, the first metal oxide layer 402, and the protective layer 401 which are stacked, in said etching each film layer corresponding to the first region "a" and the second region "b" toward the substrate 10 until the first diffusion film layer 40 corresponding to the first region "a" is exposed, the protective layer 401, the first metal oxide layer 402, and a part of the barrier layer 403 corresponding to the second region "b" are removed. Correspondingly, the forming the second diffusion film layer on the first diffusion film layer 40 corresponding to the first region "a" and the dielectric layer 30 corresponding to the second region "b" includes: forming the second diffusion film layer on the first diffusion film layer 40 corresponding to the first region "a" and the remaining barrier layer 403 corresponding to the second region "b".

With continued reference to FIG. 1, the method for manufacturing a semiconductor structure provided according to this embodiment, after forming the second diffusion film layer, further includes the following step.

In S109, heat treatment is performed on the remaining film layers corresponding to the first region and the second region.

Through heat treatment, a first metal element in the first metal oxide layer 402 is diffused into the dielectric layer 30 corresponding to the first region "a" to form an N-type transistor (NMOS), and a second metal element in the second metal oxide layer 601 is diffused into the dielectric layer 30 corresponding to the second region "b" to form a P-type transistor (PMOS).

Illustratively, the heat treatment may include perform annealing treatment on the remaining film layers corresponding to the first region "a" and the second region "b" to diffuse the first metal element in the first metal oxide layer 402 into the dielectric layer 30 corresponding to the first region "a", and diffuse the second metal element in the second metal oxide layer 601 into the dielectric layer 30 corresponding to the second region "b".

According to the method for manufacturing a semiconductor structure provided in this embodiment, the substrate 10 includes the first region "a" and the second region "b" located outside the first region "a", and the doped layer 20 is formed on the substrate 10 corresponding to the second region "b"; then, the dielectric layer 30 is formed on the substrate 10 corresponding to the first region "a" and the doped layer 20 corresponding to the second region "b"; the first diffusion film layer 40 is formed on the dielectric layer 30, the first diffusion film layer 40 includes the first metal oxide layer 402, and the thickness of the first diffusion film layer 40 is not less than a thickness of the doped layer 20; the hard mask 50 is formed on the first diffusion film layer 40 by using the spin coating method; each film layer corresponding to the first region "a" and the second region "b" is etched toward the substrate 10 until the first diffusion film layer 40 corresponding to the first region "a" is exposed; and next, the first metal oxide layer 402 remaining on the dielectric layer 30 corresponding to the second region "b" is removed. Due to the presence of the doped layer 20, there is a large distance between the doped layer 20 corresponding to the second region "b" and the substrate 10, and the hard mask 50 corresponding to the second region "b" has a small thickness. When the first diffusion film layer 40 corresponding to the first region "a" is exposed, the first diffusion film layer 40 corresponding to the second region "b" is just completely removed or a part of the first diffusion film layer 40 remains, such that damage to the film layers corresponding to the second region "b" is avoided.

In addition, after each film layer corresponding to the first region "a" and the second region "b" is etched toward the substrate 10 until the first diffusion film layer 40 corresponding to the first region "a" is exposed, the first metal oxide layer 402 remaining on the dielectric layer 30 corresponding to the second region "b" is removed, thereby preventing the first metal oxide layer 402 from remaining on the dielectric layer 30 corresponding to the second region "b", and preventing the first metal oxide layer 402 from affecting the performance of a transistor formed in the second region "b".

In one implementation, after performing heat treatment, the method further includes: forming a gate layer on the first diffusion film layer 40 corresponding to the first region "a" and the second diffusion film layer corresponding to the second region "b".

The gate layer may serve as a gate for the N-type transistor (NMOS) and the P-type transistor (PMOS) formed. Illustratively, the gate layer can be made of a metal such as copper.

In other implementations, after performing annealing treatment, the method further includes: removing the first diffusion film layer 40 and the second diffusion film layer to expose the dielectric layer 30; and forming the gate layer on the dielectric layer 30. Through the arrangement, the number of the film layers of the semiconductor structure can be reduced, thereby reducing the thickness of the semiconductor structure; in addition, the gate layer can be directly bonded with the corresponding dielectric layer 30, thereby improving the performance of the semiconductor structure.

With continued reference to FIGS. 2-9, this embodiment further provide a semiconductor structure, including: a substrate 10, the substrate 10 including a first region "a" and a second region "b" located outside the first region "a"; a doped layer 20 doped with a preset metal being provided on the substrate 10 corresponding to the second region "b"; and a dielectric layer 30 being provided on the substrate 10 corresponding to the first region "a" and the doped layer 20 corresponding to the second region "b".

Illustratively, the substrate 10 is plate-shaped, and the substrate 10 may serve as a basis for film layers formed in subsequent steps to support the other film layers formed in the subsequent steps. The substrate 10 can be made of silicon, germanium, etc. The material of the substrate 10 is not limited in this embodiment.

In an implementation in which the semiconductor structure is a dynamic random-access memory, the substrate 10 includes a core region and a peripheral region located at the periphery of the core region, the core region is used for storing data, and the first region "a" and the second region "b" can be located in the peripheral region.

Illustratively, the doped layer 20 can be made of silicon and germanium. During manufacturing, a layer of silicon can be first formed on the substrate 10 corresponding to the second region "b", and then, germanium is doped in the silicon layer to form the doped layer 20. In other implementations, the thickness of the substrate 10 in the second region "b" is greater than that of the substrate 10 in the first region "a". Then, germanium is doped on one side of the substrate 10 in the second region "b", thereby forming the doped layer 20 located on one side of the substrate 10 in the second region "b".

In the foregoing implementation, the doped layer 20 is first formed on the second region "b", and then, the dielectric layer 30 is formed on the substrate 10 corresponding to the first region "a" and the doped layer 20 corresponding to the second region "b".

In this embodiment, the dielectric layer 30 may include the first dielectric layer 301 and the second dielectric layer 302 which are stacked, the first dielectric layer 301 is provided proximal to the substrate 10, and the dielectric constant of the second dielectric layer 302 is greater than the dielectric constant of the first dielectric layer 301.

Through the arrangement, the dielectric constant of the second dielectric layer 302 is greater than the dielectric constant of the first dielectric layer 301, such that the performance of the semiconductor structure can be improved. Illustratively, the first dielectric layer 301 can be made of silicon oxide, aluminum oxide, zirconium oxide, etc, and the second dielectric layer 302 can be made of a high-k material such as hafnium silicate and zirconium silicate.

According to the semiconductor structure provided in this embodiment, a first diffusion film layer 40 is provided on the dielectric layer 30 corresponding to the first region "a", and the first diffusion film layer 40 includes a first metal oxide layer 402; and a second diffusion film layer is provided on the dielectric layer 30 corresponding to the second region "b", and the second diffusion film layer includes a second metal oxide layer 601.

Illustratively, with continued reference to FIGS. 2 and 3, during manufacturing, the first diffusion film layer 40 is first formed on the dielectric layer 30, and the thickness of the first diffusion film layer 40 is not less than a thickness of the doped layer 20. Then, a hard mask 50 is formed on the first diffusion film layer 40 by using a spin coating method. With continued reference to FIGS. 4 and 5, next, each film layer corresponding to the first region "a" and the second region "b" is etched toward the substrate 10 until the first diffusion film layer 40 corresponding to the first region "a" is exposed. With continued reference to FIGS. 6 and 7, the first metal oxide layer 402 remaining on the dielectric layer 30 corresponding to the second region "b" is removed. With continued reference to FIGS. 8 and 9, the second diffusion film layer is formed on the first diffusion film layer 40 corresponding to the first region "a" and the dielectric layer 30 corresponding to the second region "b", and the second diffusion film layer includes the second metal oxide layer 601. The first diffusion film layer 40 located on the dielectric layer 30 corresponding to the first region "a" and the second diffusion film layer located on the dielectric layer 30 corresponding to the second region "b" are further formed.

In some embodiments, the first diffusion film layer 40 includes a barrier layer 403, the first metal oxide layer 402, and a protective layer 401 which are sequentially stacked, and the barrier layer 403 is provided proximal to the substrate 10. The first metal oxide layer 402 can be made of lanthanum oxide, etc., and the barrier layer 403 and the protective layer 401 can be made of titanium nitride, etc. The protective layer 401 may protect the first metal oxide layer 402, thereby avoiding damage to the first metal oxide layer 402 during the manufacturing process, and the barrier layer 403 may adjust the diffusion rate of a first metal element in the first metal oxide layer 402 to the dielectric layer 30 during subsequent heat treatment.

With continued reference to FIGS. 4 and 5, in the foregoing implementation, since the doped layer 20 is provided between the substrate 10 and the dielectric layer 30 of the second region "b", a top surface of the first diffusion film layer 40 in the second region "b" distal from the substrate 10 is farther distal from the substrate 10 than a top surface of the first diffusion film layer 40 in the first region "a" distal from the substrate 10. Since the distance between the top surface of the mask layer 50 corresponding to the first region "a" and the substrate 10 is equal to the distance between the top surface of the mask layer 50 corresponding to the second region b and the substrate 10, when the first diffusion film layer 40 corresponding to the first region "a" is exposed, the first diffusion film layer 40 corresponding to the second region b has been etched. Further, the thickness of the first diffusion film layer 40 is not less than a thickness of the doped layer 20, such that when the first diffusion film layer 40 corresponding to the first region "a" is exposed, the first diffusion film layer 40 corresponding to the second region b has been completely etched, or a large part of the first diffusion film layer 40 corresponding to the second region b has been etched. Therefore, damage to the film layers in the first region "a" is avoided.

In the foregoing implementation, the thickness of the doped layer 20 is greater than the sum of the thickness of the first metal oxide layer 402 and the thickness of the barrier layer 401. Through the arrangement, when the film layers corresponding to the first region "a" and the second region b are etched toward the substrate, a part of the barrier layer 401 corresponding to the second region b can be retained.

Specifically, in the implementation in which the first diffusion film layer 40 includes the barrier layer 403, the first metal oxide layer 402, and the protective layer 401 which are stacked, in said etching each film layer corresponding to the first region "a" and the second region b toward the substrate 10 until the first diffusion film layer 40 corresponding to the first region "a" is exposed, the protective layer 401, the first metal oxide layer 402, and a part of the barrier layer 403 corresponding to the second region b are removed. A part of the barrier layer 403 corresponding to the second region b is retained, such that the dielectric layer 30 or another film layer corresponding to the second region b is prevented from being damaged.

In said etching each film layer corresponding to the first region "a" and the second region b, the protective layer 401, the first metal oxide layer 402, and the barrier layer 403 are sequentially etched. Illustratively, at the end of etching, a part of barrier layer 403 remains on the dielectric layer 30 corresponding to the second region b, and a part of the first metal oxide layer 402 remains on the corresponding barrier layer 403. In this case, a part of the first metal oxide layer 402 remaining on the dielectric layer 30 corresponding to the second region b is removed with wet etching, etc., thereby preventing the remaining first metal oxide layer 402 from affecting the performance of the transistor formed in the second region b.

In this embodiment, the gate layer is provided on the first diffusion film layer 40 and the second diffusion film layer, and the gate layer may serve as a gate, such that each film layer corresponding to the first region "a" forms a transistor, and each film layer corresponding to the second region b also forms a transistor. Illustratively, each film layer corresponding to the first region "a" forms the N-type transistor (NMOS), and each film layer corresponding to the second region "b" forms the P-type transistor (PMOS).

In the foregoing embodiment, after forming the second diffusion film layer, annealing treatment is performed on the remaining film layers corresponding to the first region "a" and the second region b to diffuse the first metal element in the first metal oxide layer 402 into the dielectric layer 30 corresponding to the first region "a", and diffuse the second metal element in the second metal oxide layer 601 into the dielectric layer 30 corresponding to the second region b.

In this embodiment, in said etching each film layer corresponding to the first region "a" and the second region b toward the substrate 10 until the first diffusion film layer 40 corresponding to the first region "a" is exposed, the protective layer 401, the first metal oxide layer 402, and a part of the barrier layer 403 corresponding to the second region b are removed. Therefore, a part of the barrier layer 403 exists on the dielectric layer 30 corresponding to the second region b, and the protective layer 403 is provided between the second metal oxide layer 601 and the dielectric layer 30 after the second metal oxide layer 601 is formed. Illustratively, a thickness of the protective layer 403 can be 0.1-2 nm.

In the foregoing embodiment, the first metal oxide layer 402 can be a lanthanum oxide layer, and the second metal oxide layer 601 can be an aluminum oxide layer.

According to the semiconductor structure provided in this embodiment, the substrate 10 includes the first region "a" and the second region b located outside the first region "a", and the doped layer 20 is formed on the substrate 10 corresponding to the second region b; the dielectric layer 30 is formed on the substrate 10 corresponding to the first region "a" and the doped layer 20 corresponding to the second region b; after the dielectric layer 30 is formed, the first diffusion film layer 40 is formed on the dielectric layer 30, the first diffusion film layer 40 includes the first metal oxide layer 402, and the thickness of the first diffusion film layer 40 is not less than a thickness of the doped layer 20; the hard mask 50 is formed on the first diffusion film layer 40 by using the spin coating method; each film layer corresponding to the first region "a" and the second region b is etched toward the substrate 10 until the first diffusion film layer 40 corresponding to the first region "a" is exposed; and next, the first metal oxide layer 402 remaining on the dielectric layer 30 corresponding to the second region b is removed. Due to the presence of the doped layer 20, there is a large distance between the doped layer 20 corresponding to the second region b and the substrate 10, and the hard mask 50 corresponding to the second region b has a small thickness. When the first diffusion film layer 40 corresponding to the first region "a" is exposed, the first diffusion film layer 40 corresponding to the second region b is just completely removed or a part of the first diffusion film layer 40 remains, such that damage to the film layers corresponding to the second region b is avoided.

It should be explained at last: the foregoing embodiments are merely intended for describing the technical solutions of the present disclosure other than limiting the present disclosure. Although the present disclosure is described in detail with reference to the foregoing embodiments, persons skilled in the art should understand that they may still make modifications to the technical solutions described in the foregoing embodiments or make equivalent replacements to some or all technical features thereof, and such modifications or replacements do not depart the essence of the corresponding technical solutions from the scope of the technical solutions of the embodiments of the present disclosure.

What is claimed is:

1. A method for manufacturing a semiconductor structure, comprising:
    providing a substrate, the substrate comprising a first region, and a second region located outside the first region;
    forming a doped layer doped with a preset metal on the substrate corresponding to the second region;
    forming a dielectric layer on the substrate corresponding to the first region, and on the doped layer corresponding to the second region;
    forming a first diffusion film layer on the dielectric layer, the first diffusion film layer comprising a first metal oxide layer, and a thickness of the first diffusion film layer being not less than a thickness of the doped layer;
    forming a hard mask on the first diffusion film layer by using a spin coating method;
    etching each film layer corresponding to the first region and the second region toward the substrate, until the first diffusion film layer corresponding to the first region is exposed;
    removing the first metal oxide layer remaining on the dielectric layer corresponding to the second region;
    forming a second diffusion film layer on the first diffusion film layer corresponding to the first region, and on the dielectric layer corresponding to the second region, the second diffusion film layer comprising a second metal oxide layer; and
    performing heat treatment on remaining film layers corresponding to the first region and the second region.

2. The method for manufacturing a semiconductor structure of claim 1, wherein the etching each film layer corresponding to the first region and the second region toward the substrate, until the first diffusion film layer corresponding to the first region is exposed comprises:
    etching each film layer corresponding to the first region and the second region toward the substrate by dry etching, until the first diffusion film layer in the first region is exposed.

3. The method for manufacturing a semiconductor structure of claim 1, wherein the removing the first metal oxide layer remaining on the dielectric layer corresponding to the second region comprises:
    removing the first metal oxide layer remaining on the dielectric layer corresponding to the second region by wet etching.

4. The method for manufacturing a semiconductor structure of claim 1, wherein the forming the first diffusion film layer on the dielectric layer comprises:
    sequentially forming a barrier layer, the first metal oxide layer, and a protective layer on the dielectric layer in a stacked manner.

5. The method for manufacturing a semiconductor structure of claim 4, wherein the thickness of the doped layer is greater than a sum of a thickness of the first metal oxide layer and a thickness of the barrier layer.

6. The method for manufacturing a semiconductor structure of claim 5, wherein in a process of the etching each film layer corresponding to the first region and the second region toward the substrate, until the first diffusion film layer corresponding to the first region is exposed, the protective layer, the first metal oxide layer, and a part of the barrier layer corresponding to the second region are removed.

7. The method for manufacturing a semiconductor structure of claim 6, wherein the forming the second diffusion film layer on the first diffusion film layer corresponding to the first region, and on the dielectric layer corresponding to the second region comprises:
    forming the second diffusion film layer on the first diffusion film layer corresponding to the first region and a remaining barrier layer corresponding to the second region.

8. The method for manufacturing a semiconductor structure of claim 6, wherein after the protective layer, the first metal oxide layer, and the part of the barrier layer corresponding to the second region are removed, the thickness of the barrier layer corresponding to the second region is 0.1-2 nm.

9. The method for manufacturing a semiconductor structure of claim 1, wherein the performing heat treatment on the remaining film layers corresponding to the first region and the second region comprises:
    performing annealing treatment to diffuse a first metal element in the first metal oxide layer into the dielectric layer corresponding to the first region and diffuse a second metal element in the second metal oxide layer into the dielectric layer corresponding to the second region at the same time.

10. The method for manufacturing a semiconductor structure of claim 9, after the performing annealing treatment, further comprising: forming a gate layer on the first diffusion film layer corresponding to the first region and the second diffusion film layer corresponding to the second region.

11. The method for manufacturing a semiconductor structure of claim 9, after the performing annealing treatment, further comprising:
    removing the first diffusion film layer and the second diffusion film layer to expose the dielectric layer; and
    forming the gate layer on the dielectric layer.

12. The method for manufacturing a semiconductor structure of claim 1, wherein the forming the dielectric layer on the substrate corresponding to the first region, and on the doped layer corresponding to the second region comprises:
    sequentially forming a first dielectric layer and a second dielectric layer on the substrate corresponding to the first region, and on the doped layer corresponding to the second region in a stacked manner, a dielectric constant of the second dielectric layer being greater than a dielectric constant of the first dielectric layer.

13. A semiconductor structure, comprising:
    a substrate, the substrate comprising a first region, and a second region located outside the first region; a doped layer doped with a preset metal being provided on the substrate corresponding to the second region; a dielectric layer being provided on the substrate corresponding to the first region, and on the doped layer corresponding to the second region;
    a first diffusion film layer being provided on the dielectric layer corresponding to the first region, and the first diffusion film layer comprising a first metal oxide layer; and a second diffusion film layer being provided on the dielectric layer corresponding to the second region, and the second diffusion film layer comprising a second metal oxide layer;
    wherein the semiconductor structure is manufactured by a method comprising:

providing the substrate, the substrate comprising the first region, and the second region located outside the first region;

forming the doped layer doped with the preset metal on the substrate corresponding to the second region;

forming the dielectric layer on the substrate corresponding to the first region, and on the doped layer corresponding to the second region;

forming the first diffusion film layer on the dielectric layer, the first diffusion film layer comprising the first metal oxide layer, and a thickness of the first diffusion film layer being not less than a thickness of the doped layer;

forming a hard mask on the first diffusion film layer by using a spin coating method;

etching each film layer corresponding to the first region and the second region toward the substrate, until the first diffusion film layer corresponding to the first region is exposed;

removing the first metal oxide layer remaining on the dielectric layer corresponding to the second region;

forming the second diffusion film layer on the first diffusion film layer corresponding to the first region, and on the dielectric layer corresponding to the second region, the second diffusion film layer comprising the second metal oxide layer; and performing heat treatment on remaining film layers corresponding to the first region and the second region.

14. The semiconductor structure of claim 13, wherein the first diffusion film layer comprises a barrier layer, the first metal oxide layer, and a protective layer which are sequentially stacked, and the barrier layer is provided proximal to the substrate.

15. The semiconductor structure of claim 13, wherein a first protective layer is provided between the second metal oxide layer and the dielectric layer, and a thickness of the first protective layer is 0.1-2 nm.

16. The semiconductor structure of claim 13, wherein the dielectric layer comprises a first dielectric layer and a second dielectric layer which are stacked, the first dielectric layer is provided proximal to the substrate, and a dielectric constant of the second dielectric layer is greater than a dielectric constant of the first dielectric layer.

17. The semiconductor structure of claim 13, wherein a gate layer is provided on the first diffusion film layer and the second diffusion film layer.

18. The semiconductor structure of claim 17, wherein each film layer corresponding to the first region forms an N-type transistor, and each film layer corresponding to the second region forms a P-type transistor.

19. The semiconductor structure of claim 13, wherein the first metal oxide layer is a lanthanum oxide layer, and the second metal oxide layer is an aluminum oxide layer.

* * * * *